US012771327B1

(12) United States Patent
Wall

(10) Patent No.: US 12,771,327 B1
(45) Date of Patent: Oct. 20, 2026

(54) TRANSMITTER CIRCUIT AND METHOD WITH ENERGY CONVERSION IN NONLINEAR ELECTROMECHANICAL MATCHING NETWORK

(71) Applicant: HRL Laboratories, LLC, Malibu, CA (US)

(72) Inventor: Walter S. Wall, Thousand Oaks, CA (US)

(73) Assignee: HRL Laboratories, LLC, Malibu, CA (US)

( * ) Notice: Subject to any disclaimer, the term of this patent is extended or adjusted under 35 U.S.C. 154(b) by 287 days.

(21) Appl. No.: 18/747,847

(22) Filed: Jun. 19, 2024

(51) Int. Cl.
*H03H 11/30* (2006.01)
*H03H 9/00* (2006.01)
*H03H 9/46* (2006.01)
*H04B 1/04* (2006.01)

(52) U.S. Cl.
CPC .......... *H03H 11/30* (2013.01); *H03H 9/0004* (2013.01); *H03H 9/465* (2013.01); *H04B 1/0458* (2013.01); *H04B 2001/0491* (2013.01)

(58) Field of Classification Search
CPC ...... H03H 11/30; H03H 9/465; H04B 1/0458; H04B 2001/0491
See application file for complete search history.

(56) References Cited

U.S. PATENT DOCUMENTS 3,652,958 A * 3/1972 Zelina .................... H02M 1/14 307/104
9,369,105 B1 * 6/2016 Li .......................... H10N 30/87
9,660,349 B2 * 5/2017 Keller ...................... H03H 9/25
10,177,737 B1 * 1/2019 Kubena .................... H03H 9/56
10,389,392 B1 * 8/2019 Kubena ................ H01Q 21/065
10,491,074 B2 * 11/2019 Kuznetsov ............. H02K 7/025
(Continued)

FOREIGN PATENT DOCUMENTS

EP 3646410 5/2020
EP 3646410 B1 * 8/2023 ............... H04B 1/18

OTHER PUBLICATIONS

P. A. Kyaw et al.; "Fundamental Examination of Multiple Potential Passive Component Technologies for Future Power Electronics," IEEE Transactions on Power Electronics, vol. 32, No. 11, pp. 8607-8619, Nov. 2017, IEEE, New York, NY, USA.
(Continued)

*Primary Examiner* — Hai V Nguyen
(74) *Attorney, Agent, or Firm* — Wheatstone IP Law Corporation; Milad G. Shara

(57) ABSTRACT

Transmitter circuits and methods configure an electromechanical matching network to provide an electromechanical matching signal having a center frequency and a plurality of non-center frequencies in response to a drive signal from a drive circuit. An energy recovery signal is extracted from the electromechanical matching signal, the energy recovery signal representing at least one non-center frequency from the plurality of non-center frequencies. The energy recovery signal is used to supply a recovered voltage signal to a drive circuit that provides the drive signal. A transmitter terminal provides an impedance matched signal having the center frequency that resonates a load at the resonant frequency. The impedance matched signal represents the electromechanical matching signal excluding the energy recovery signal.

22 Claims, 9 Drawing Sheets

(56) References Cited

U.S. PATENT DOCUMENTS

| | | | | |
|---|---|---|---|---|
| 10,921,360 | B2 * | 2/2021 | Kubena | G01R 29/0878 |
| 11,101,786 | B1 * | 8/2021 | Kubena | H03H 9/1021 |
| 11,156,897 | B2 * | 10/2021 | Kubena | G04G 3/04 |
| 11,211,711 | B2 * | 12/2021 | Wall | H01Q 9/14 |
| 11,563,420 | B1 * | 1/2023 | Kubena | H10N 35/101 |
| 11,569,684 | B1 * | 1/2023 | White | H02J 7/345 |
| 11,988,727 | B1 * | 5/2024 | Kubena | H03B 5/366 |
| 12,034,235 | B2 * | 7/2024 | Wall | H03H 7/38 |
| 12,272,522 | B2 * | 4/2025 | Bhutta | H01J 37/32183 |
| 12,334,307 | B2 * | 6/2025 | Decker | H01J 37/32183 |
| 12,627,379 | B2 * | 5/2026 | Mirhosseini | G06N 10/40 |
| 2006/0197385 | A1 * | 9/2006 | Levin | H02J 3/01 307/105 |
| 2013/0197298 | A1 * | 8/2013 | Miller | H04R 25/00 600/25 |
| 2014/0163308 | A1 * | 6/2014 | Miller | H04R 1/2896 29/25.35 |
| 2014/0328088 | A1 * | 11/2014 | Wang | H02M 3/33507 363/21.01 |
| 2016/0209454 | A1 * | 7/2016 | McCammon | G01R 1/07 |
| 2016/0380357 | A1 * | 12/2016 | Keller | G01R 33/093 216/13 |
| 2017/0014184 | A1 * | 1/2017 | Hancock | A61B 18/1492 |
| 2017/0063192 | A1 * | 3/2017 | Kuznetsov | H02K 7/025 |
| 2018/0226720 | A1 * | 8/2018 | Wall | H01Q 1/22 |
| 2020/0051785 | A1 * | 2/2020 | Miller | H03K 3/57 |
| 2021/0091748 | A1 * | 3/2021 | Kubena | G02F 1/353 |
| 2022/0077588 | A1 * | 3/2022 | Wall | H01Q 9/14 |
| 2022/0254610 | A1 * | 8/2022 | Bhutta | H01J 37/32183 |
| 2023/0215696 | A1 * | 7/2023 | Decker | H01J 37/32183 333/17.3 |
| 2024/0145216 | A1 * | 5/2024 | Bhutta | H01J 37/32128 |
| 2024/0177970 | A1 * | 5/2024 | Bhutta | H01J 37/32183 |
| 2025/0015900 | A1 * | 1/2025 | Mirhosseini | G06N 10/40 |

OTHER PUBLICATIONS

V. Kaajakari et al.; "Nonlinear Limits for Single-Crystal Silicon Microresonators," IEEE Journal of Microelectromechanical Systems, vol. 13, No. 5, pp. 715-729, Oct. 2004, IEEE, New York, NY, USA.

J. Lyon et al.; "Tunable Electrically Small Antennas for 30-100 MHZ Operation," Air Force Avionics Laboratory (AFAL/ TEM), Wright-Patterson Air Force Base, Dayton, Ohio, Apr. 1971; 60 pages.

* cited by examiner

TRANSMITTER CIRCUIT AND METHOD WITH ENERGY CONVERSION IN NONLINEAR ELECTROMECHANICAL MATCHING NETWORK

TECHNICAL FIELD

The present description relates generally to impedance matching and electromechanical matching networks.

BACKGROUND

Electromechanical resonators may be used to match radio frequency (RF) drive signals to electrically small and highly reactive antennas. However, power handling for electromechanical resonators is typically lower due to the onset of mechanical nonlinearities, which results in reduced efficiency at higher power levels from increased harmonic generation. Accordingly, electromechanical resonators operate within their linear mode of operation to avoid reduced efficiency, which consequently limits the power level of the RF drive signals that drive the electromechanical resonators.

There is a need for efficiently driving electromechanical resonators at power levels beyond their linear mode of operation.

DESCRIPTION OF DRAWINGS

Like reference symbols in the various figures indicate like elements.

DETAILED DESCRIPTION

FIGS. 1-9B illustrate transmitter circuits and methods for utilizing electromechanical matching networks beyond their linear region of operation by employing an energy recovery circuit to extract and recycle energy transferred from a drive input signal to non-center frequencies such as higher frequency harmonics. For example, an electromechanical matching network may include one or more electromechanical resonators connected in series to an electrically small antenna such as a monopole or dipole antenna. The electromechanical resonators have a nonlinear response to a signal amplitude of the drive input signal. A shunt recovery circuit, such as a filter coupled to a rectifier circuit, is connected in shunt between an output terminal of the electromechanical matching network and a transmitter terminal that is coupled to the antenna. A DC output of the rectifier circuit may be connected to a DC-DC converter and battery which is used to supply voltage to an RF source that provides the drive input signal. The filter may be a band reject filter (band notch filter) or a bandpass filter. In some embodiments, the filter may be an electromechanical resonator or an array of electromechanical resonators. In the electromechanical matching networks, a single resonator may be replaced by an array of resonators with individual energy recovery circuits connected together.

The disclosed embodiment can be used for efficiently operating electromechanical resonators as matching components in their nonlinear regime, and the energy recovery circuits and methods can extend the range of the electromechanical resonators. High density matching components can be used efficiently in their nonlinear operation by rectifying harmonics and supplying the resulting DC energy back to the original RF source. For example, the disclosed embodiments may be used in RF systems operating below 300 MHz, such as very low frequency (VLF), high frequency (HF), and very high frequency (VHF) radios. The disclosed embodiments can also be used in high quality factor and high energy density of electromechanical resonators at higher power levels.

Figure 1:
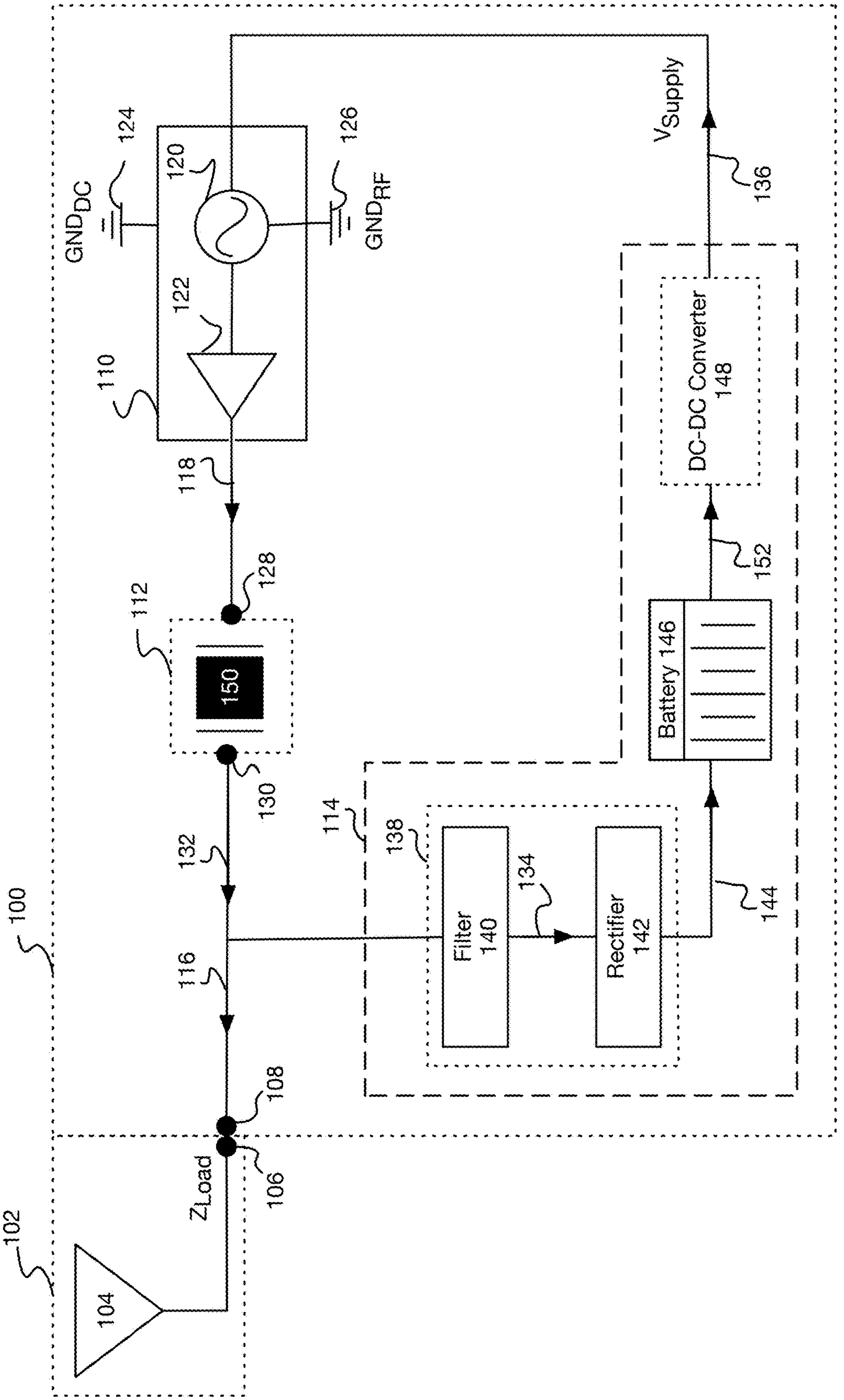
FIG. 1 is a diagram of a transmitter circuit for impedance matching to a load having a resonant frequency according to an embodiment.

FIG. 1 is a diagram of a transmitter circuit 100 for impedance matching to a load 102 having a resonant frequency fr according to an embodiment. The load 102 may include an antenna 104 such as a monopole or dipole antenna, and a load terminal 106 coupled to an input of the antenna 104. The transmitter circuit 100 includes a transmitter terminal 108, a drive circuit 110, an electromechanical matching network 112, and an energy recovery circuit 114. The transmitter terminal 108 is configured to couple with the load terminal 106 of the antenna 104 in the load 102. The transmitter terminal 108 provides an impedance matched signal 116 comprising a center frequency $f_c$ that resonates the load 102 at the resonant frequency fr. The drive circuit 110 is configured to provide a drive signal 118 having a signal amplitude and a signal frequency comprising the center frequency $f_c$. The drive circuit 110 may be a radio frequency (RF) drive circuit that includes a voltage-controlled oscillator 120 (or a digital to analog converter) coupled to a radio frequency amplifier 122. The drive circuit 110 has a DC ground reference 124 that provides a voltage reference for the radio frequency amplifier 122, and an RF ground reference 126 that provides a voltage reference for the voltage-controlled oscillator 120.

The electromechanical matching network 112 includes an input terminal 128 coupled to the drive circuit 110 and an output terminal 130 coupled to the transmitter terminal 108. The electromechanical matching network 112 is configured to provide an electromechanical matching signal 132 comprising the center frequency $f_c$ and a plurality of non-center frequencies in response to the drive signal 118. The plurality of non-center frequencies is in response to the signal amplitude of the drive signal 118. The non-center frequencies may be a plurality of harmonic frequencies $2f_c$, $3f_c$ . . . . $Hf_c$, where H is the number of harmonic frequencies that are higher-frequency components of the electromechanical matching signal 132.

The energy recovery circuit 114 is configured to extract an energy recovery signal 134 from the electromechanical matching signal 132 and supply a recovered voltage signal 136 from the energy recovery signal 134 as a voltage supply Vsupply to the drive circuit 110. The energy recovery signal 134 represents at least one non-center frequency from the plurality of non-center frequencies in the electromechanical matching signal 132. For example, the at least one non-center frequency may be the third harmonic frequency $3f_c$ in the electromechanical matching signal 132. In some embodiments, the at least one non-center frequency may include several harmonics such as the second harmonic frequency $2f_c$, the third harmonic frequency $3f_c$ and the fifth harmonic frequency $5f_c$. The impedance matched signal 116 represents the electromechanical matching signal 132 excluding the energy recovery signal 134 having the at least non-center frequency such as the third harmonic frequency $3f_c$.

The energy recovery circuit 114 is coupled in shunt between the transmitter terminal 108 and the output terminal 130 of the electromechanical matching network 112. The energy recovery circuit 114 may include a shunt recovery circuit 138 coupled in shunt between the transmitter terminal 108 and the output terminal 130 of the electromechanical matching network 112. The shunt recovery circuit 138 may include a filter 140 and a rectifier 142 coupled in series with the filter 140. The filter 140 may be configured to extract the energy recovery signal 134 from the electromechanical matching signal 132. For example, the filter 140 may be configured to isolate at least one non-center frequency from the center frequency such that the center frequency is buffered and delivered to the load 102, and the isolated (extracted) at least one non-center frequency (energy recovery signal 134) is provided to the rectifier 142 according to an embodiment. The rectifier 142 may be configured to rectify the extracted energy recovery signal 134 into a rectified voltage signal 144 that is used for supplying the recovered voltage signal 136 to the drive circuit 110. The energy recovery circuit 114 may include a battery 146 coupled to the shunt recovery circuit 138. The battery 146 is configured to store voltage from the rectified voltage signal 144. The energy recovery circuit 114 may include a DC-DC converter 148 configured to supply stored voltage 152 from the battery 146 as the recovered voltage signal 136 to the drive circuit 110.

The electromechanical matching network 112 comprises at least one electromechanical resonator 150 having a non-linear response to the signal amplitude of the drive signal 118. The electromechanical resonator 150 may include a high Q bulk mode resonator such as a Quartz, $LiNbO_3$, or SiC shear, extensional mode, or Bulk Acoustic Wave (BAW) resonator to ensure that an efficient low loss impedance match to the antenna can be achieved. Examples of the electromechanical resonator are illustrated in commonly-owned U.S. Pat. No. 11,211,711 titled Antenna Dynamically Matched with Electromechanical Resonators; commonly-owned U.S. Pat. No. 10,389,392 titled High-Q Quartz-Based Inductor Array for Antenna Matching; U.S. Pat. No. 10,177,737 titled High-Q Quartz-Based Inductors for High Power LF Communication; and commonly-owned International Application Number PCT/US2018/025596 titled Antenna Loaded with Electromechanical Resonators, each of which are hereby incorporated by reference in its entirety.

When excited with strong driving voltages, the electromechanical resonator 150 may exhibit nonlinear mechanical and electrical responses, which will manifest as harmonic content at the electrodes of the resonator device. At high drive level, the nonlinear mechanical and electrical responses may be viewed as a source of loss in energy of the fundamental drive signal exciting the resonators. To recover the energy lost to these mechanisms, the disclosed embodiments illustrate connecting the energy recovery circuit 114 in shunt between the electromechanical resonator 150 of the electromechanical matching network 112 and the antenna 104 in the load 102.

Figure 2:
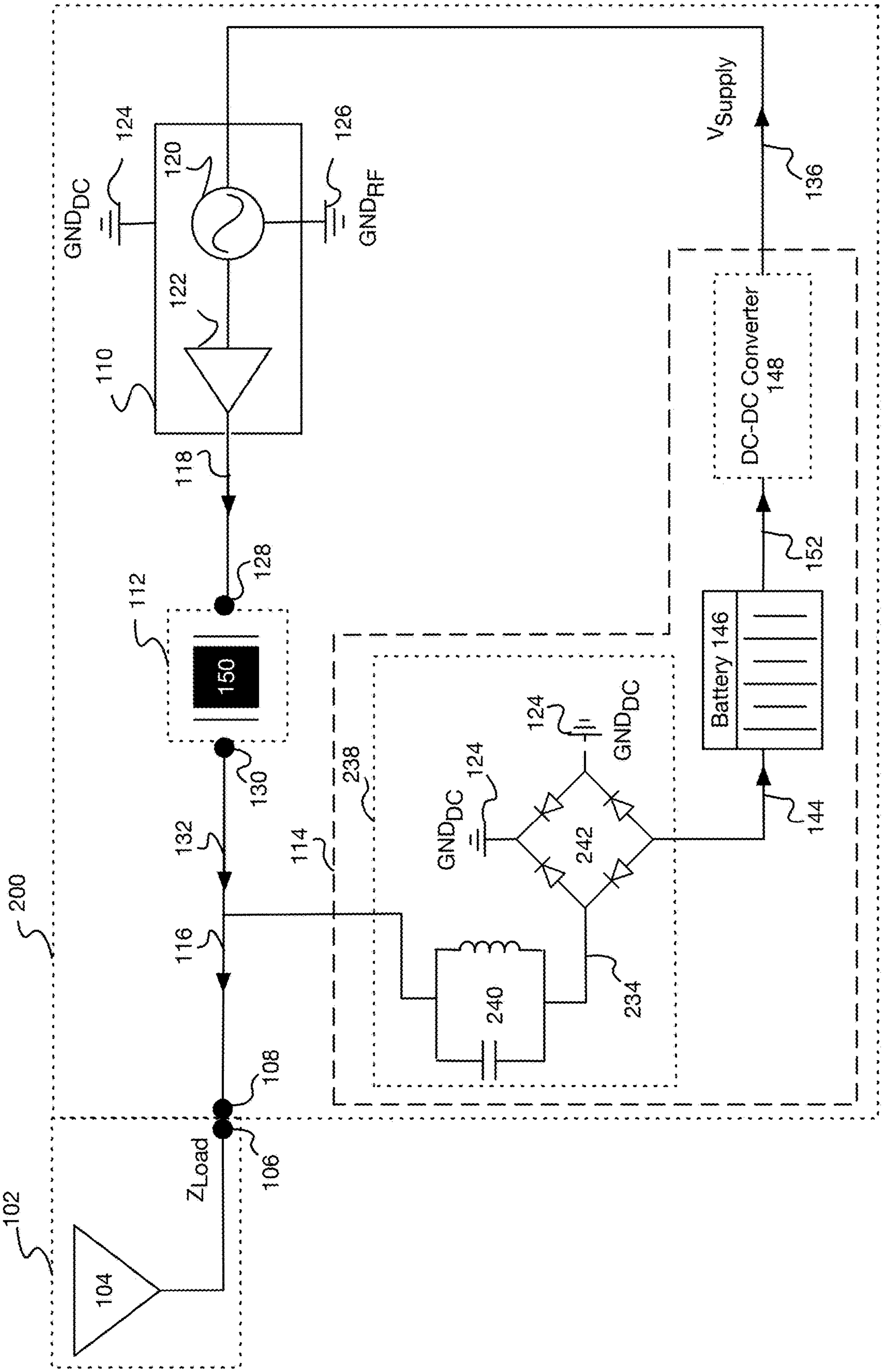
FIG. 2 is a diagram illustrating the transmitter circuit of FIG. 1 having an energy recovery circuit configured with a band reject filter and a rectifier according to an embodiment.

FIG. 2 illustrates an embodiment of a transmitter circuit 200 that is similar to the transmitter circuit 100 of FIG. 1, except the shunt recovery circuit 138 is illustrated as a shunt recovery circuit 238. The shunt recovery circuit 238 may include a band reject filter 240 and a full bridge rectifier circuit 242. The band reject filter may be an LC tank circuit that is configured to extract an energy recovery signal 234 from the electromechanical matching signal 132. The band reject filter may be designed with a large impedance or "open-circuit" impedance over the operating bandwidth of the drive circuit 110 and a low impedance or "short-circuit" impedance outside of this bandwidth. The effect of this impedance profile is that at the drive frequency of the system, power is radiated efficiently from the antenna 104 with low loss, while power in signals outside of this band such as any harmonics generated by nonlinearities in the electromechanical resonator 150 are delivered efficiently to the rectifier circuit 242.

Energy recovered by the rectifier circuit 242 is generated as a DC voltage and stored across the battery 146 which is electrically connected to the DC ports of the rectifier circuit 242. The DC-DC converter 148 may be electrically connected to the battery 146, with the secondary side of the DC-DC converter 148 electrically connected to the supply voltage of the drive circuit 110, to convert the output voltage of the battery 146 into the required supply voltage for the drive circuit 110. The effect of the transmitter circuit 200 is that energy lost in the fundamental drive signal due to nonlinear conversion in the electromechanical resonator 150 into harmonic content can be recovered and resupplied to the drive circuit 110, reducing the total system losses due to nonlinear interactions and improving the efficiency of the electromechanical matching network at high drive levels.

Figure 3:
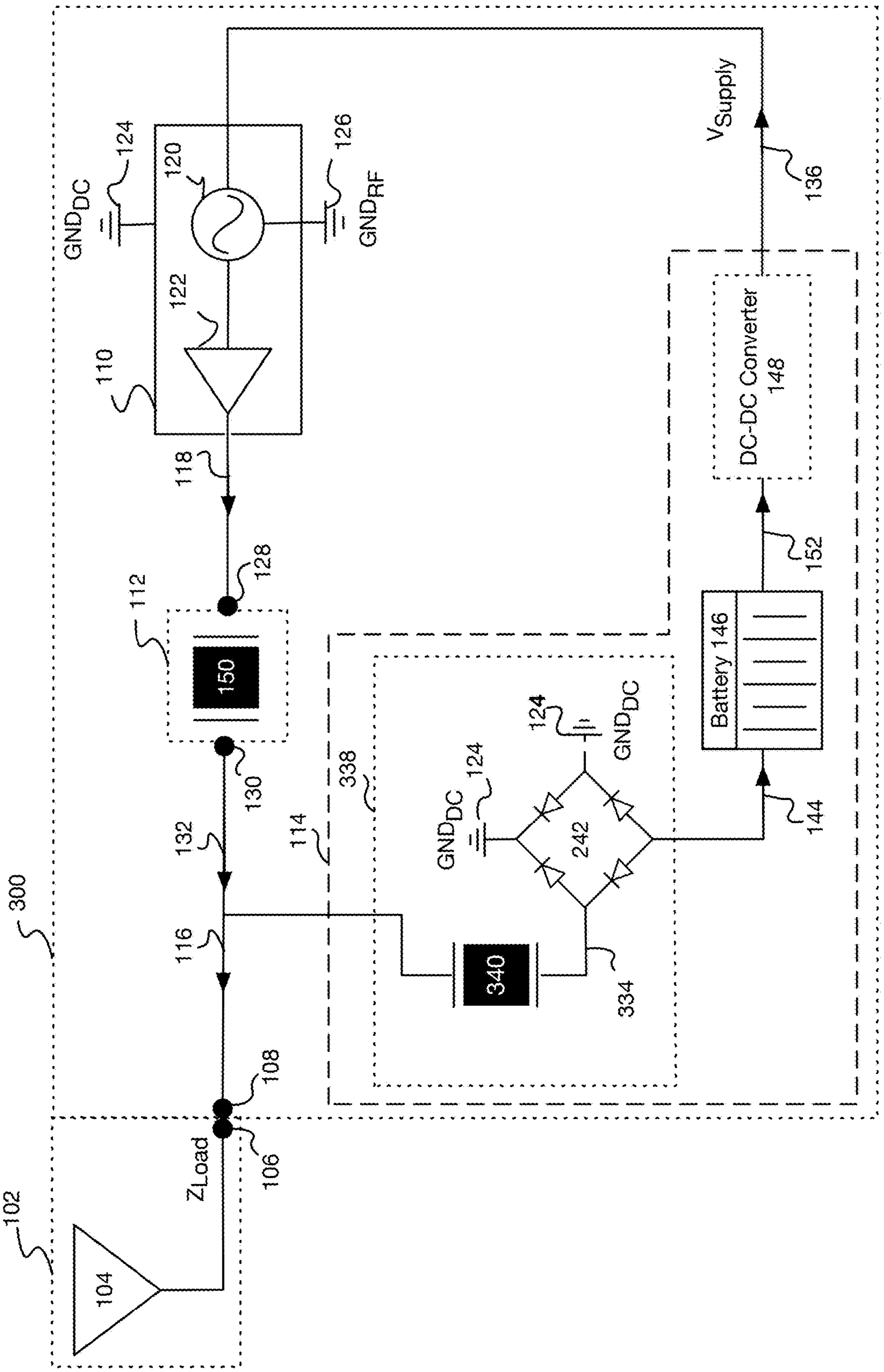
FIG. 3 is a diagram illustrating the transmitter circuit of FIG. 2 having the filter in the energy recovery circuit configured as an electromechanical resonator according to an embodiment.

FIG. 3 illustrates an embodiment of a transmitter circuit 300 that is similar to the transmitter circuit 200 of FIG. 2, except the shunt recovery circuit 238 is illustrated as a shunt recovery circuit 338 having an electromechanical resonator 340 instead of the band reject filter 240 of FIG. 2. The electromechanical resonator 340 is configured with parallel resonance at the center frequency of the transmitter circuit 300 to extract an energy recovery signal 334 from the electromechanical matching signal 132 having the at least one non-center frequency such as the third harmonic frequency $3f_c$. For low frequency RF applications, the size of high Q inductors can be very large and may require a very large band reject filter for the embodiment illustrated in FIG. 2. The embodiment illustrated in FIG. 3 may be configured with a more compact electromechanical resonator to generate a high Q filter response that can provide a high impedance at the center frequency of the transmitter circuit 300 to efficiently deliver power to the antenna 104 while simultaneously providing a very low impedance at the harmonic frequencies to efficiently deliver power at those frequencies to the rectifier circuit 242.

Figure 4:
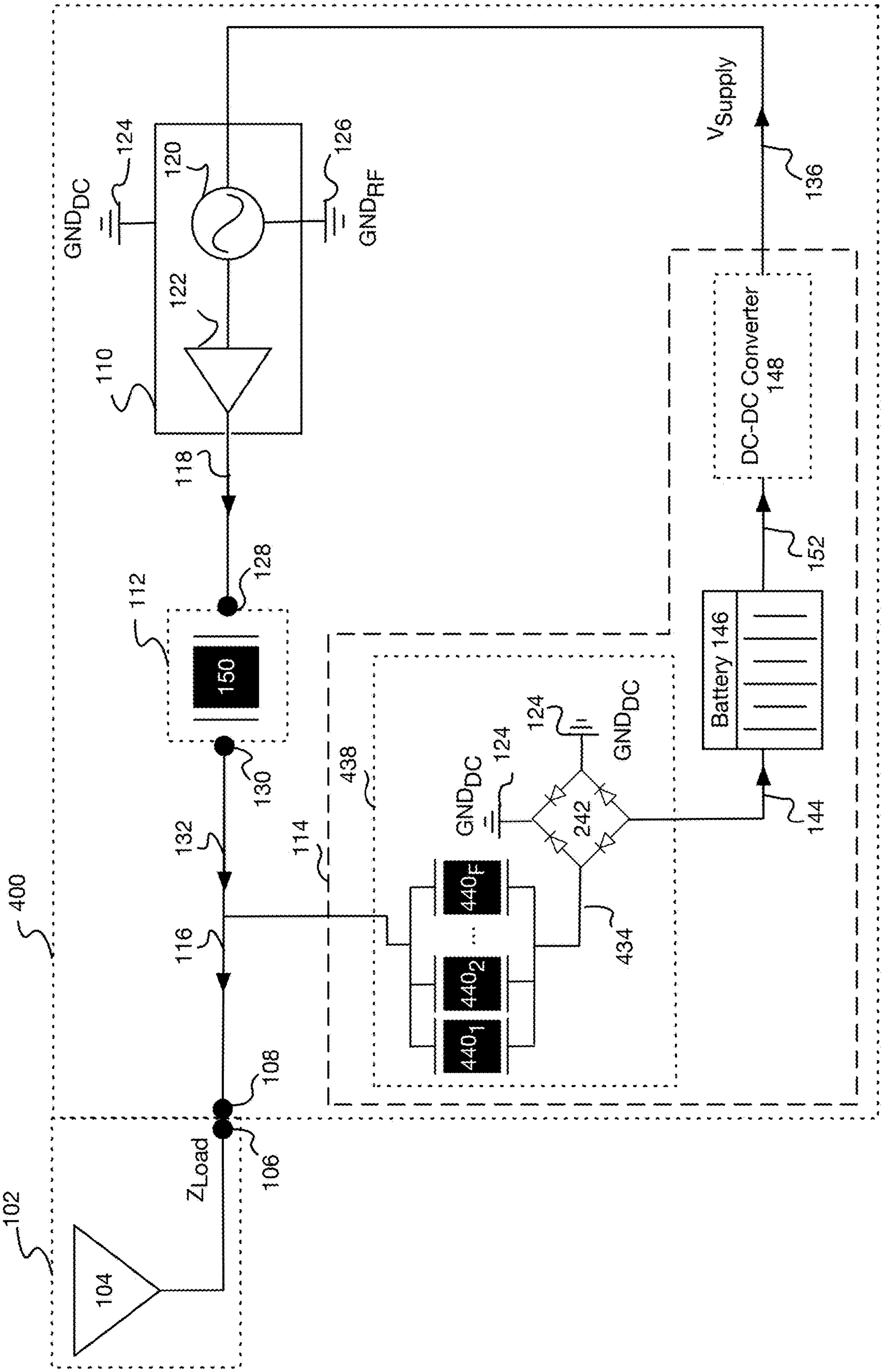
FIG. 4 is a diagram illustrating the transmitter circuit of FIG. 3 having the filter in the energy recovery circuit configured as a plurality of electromechanical resonators according to an embodiment.

FIG. 4 illustrates an embodiment of a transmitter circuit 400 that is similar to the transmitter circuit 300 of FIG. 3, except the shunt recovery circuit 338 is illustrated as a shunt recovery circuit 438 having an array of identical parallel electromechanical resonators $\mathbf{440}_1$ to $\mathbf{440}_F$ (instead of the single electromechanical resonator 340 of FIG. 3) whose parallel resonance is equal to the center frequency of the transmitter circuit 400. The subscript F represents the number of electromechanical resonators 1 to F. The array of identical parallel resonators $\mathbf{440}_1$ to $\mathbf{440}_F$ are configured to extract the energy recovery signal 434 having at least one non-center frequency from the electromechanical matching signal 132. For example, each resonator in an array of three resonators $\mathbf{440}_1$ to $\mathbf{440}_3$ may be uniquely configured to extract one of the harmonics such that the array of resonators $\mathbf{440}_1$ to $\mathbf{440}_3$ extracts the second harmonic frequency $2f_c$, the third harmonic frequency $3f_c$, and the fifth harmonic frequency $5f_c$ from the electromechanical matching signal 132 to provide the energy recovery signal 434.

Figure 5:
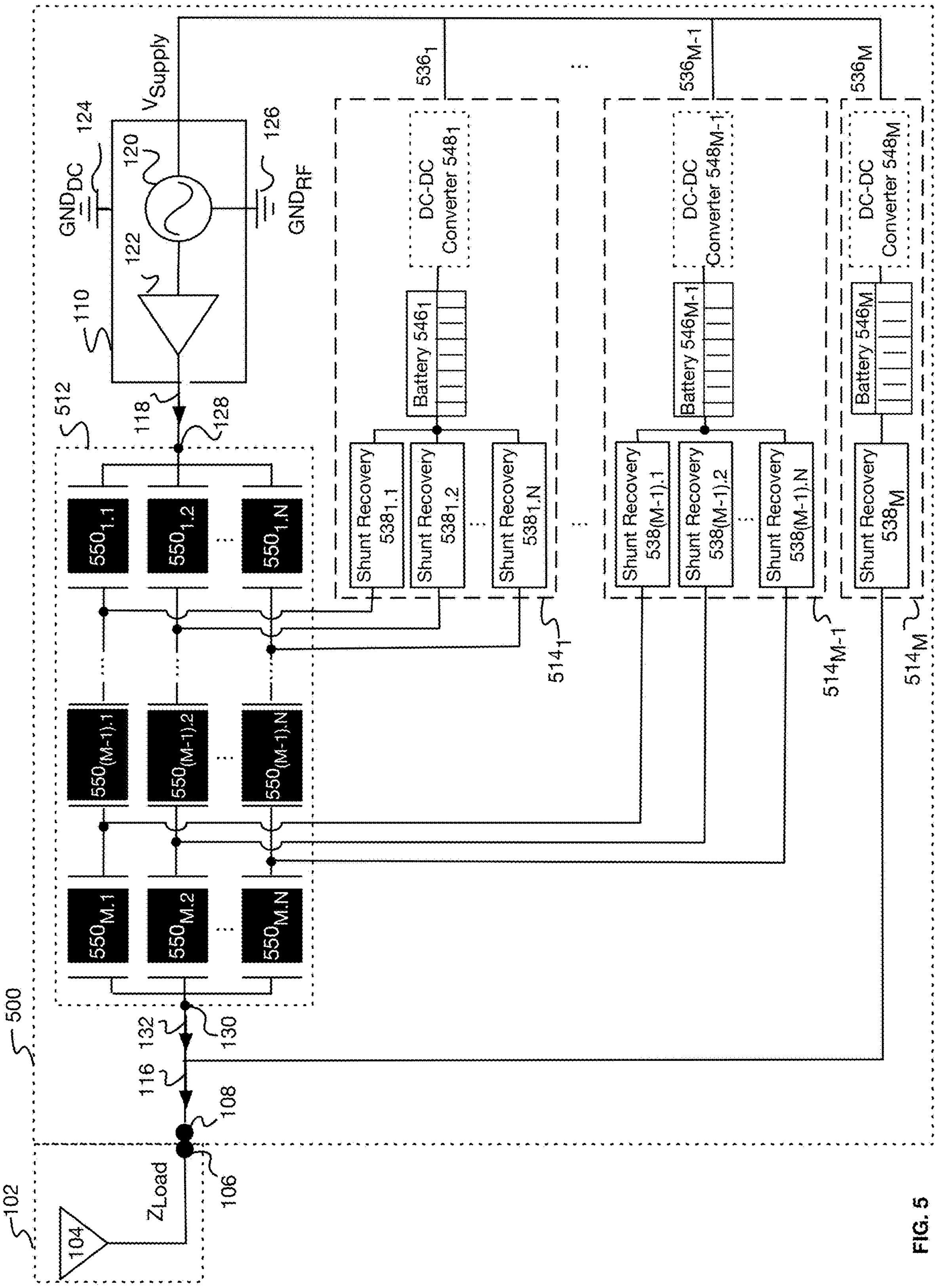
FIG. 5 is a diagram illustrating the transmitter circuit of FIG. 1 having an electromechanical matching network with an array of electromechanical resonators coupled to an array of energy recovery circuits according to an embodiment.

FIG. 5 illustrates an embodiment of a transmitter circuit 500 that is similar to the transmitter circuit 100 of FIG. 1, except the transmitter circuit 500 includes an electromechanical matching network 512 having an array of electromechanical resonators $\mathbf{550}_{1.1}$ to $\mathbf{550}_{M.N}$, and a group of energy recovery circuits $\mathbf{514}_1$ to $\mathbf{514}_M$ coupled to the array of electromechanical resonators $\mathbf{550}_{1.1}$ to $\mathbf{550}_{M.N}$. The array of electromechanical resonators $\mathbf{550}_{1.1}$ to $\mathbf{550}_{M.N}$ is configured in M columns by N rows of electromechanical resonators m.n, where N represents the number of rows 1 to N, n represents the $n^{th}$ row of electromechanical resonators, M represents the number columns 1 to M, and m represents the $m^{th}$ column of electromechanical resonators.

Each energy recovery circuit $\mathbf{514}_m$ may include a shunt recovery circuit $\mathbf{538}_m$, a battery $\mathbf{546}_m$, and an optional DC-DC converter $\mathbf{548}_m$ that are similar to the embodiments illustrated in FIGS. 1-4. The energy recovery circuits $\mathbf{514}_1$ to $\mathbf{514}_{M-1}$ may be coupled to output terminals of electromechanical resonators $\mathbf{550}_{1.1}$ to $\mathbf{550}_{(M-1).N}$, and the energy recovery circuit $\mathbf{514}_M$ may be coupled to output terminals of the electromechanical resonators $\mathbf{550}_{M.1}$ to $\mathbf{550}_{M.N}$ (last column in the array of electromechanical resonators $\mathbf{550}_{M.N}$), according to an embodiment.

The energy recovery circuits $\mathbf{514}_1$ to $\mathbf{514}_{M-1}$ each include a group of N shunt recovery circuits $\mathbf{538}_{m.1}$ to $\mathbf{538}_{m.N}$ coupled to the battery $\mathbf{546}_m$ and an optional DC-DC converter $\mathbf{548}_m$. The energy recovery circuit $\mathbf{514}_m$ in the energy recovery circuits $\mathbf{514}_1$ to $\mathbf{514}_{M-1}$ is uniquely coupled to the $m^{th}$ column of electromechanical resonators $\mathbf{550}_{(M-1).N}$. The shunt recovery circuit $\mathbf{538}_{m.n}$ in each of the energy recovery circuits $\mathbf{514}_1$ to $\mathbf{514}_{M-1}$ is uniquely coupled in shunt to an output terminal of an electromechanical resonator $\mathbf{550}_{m.n}$ in the $n^{th}$ row of electromechanical resonators $\mathbf{550}_{m.n}$.

For the energy recovery circuits $\mathbf{514}_1$ to $\mathbf{514}_{M-1}$, each shunt recovery circuit $\mathbf{538}_{m.n}$ includes a filter that is configured to extract an energy recovery signal from the electromechanical matching signal at the output terminal of a single electromechanical resonator in the $n^{th}$ row of electromechanical resonators. For the energy recovery circuit $\mathbf{514}_M$, the shunt recovery circuit $\mathbf{538}_M$ includes a filter that is configured to extract an energy recovery signal from the electromechanical matching signal at the output terminal of each electromechanical resonator in the electromechanical resonators $\mathbf{550}_{M.1}$ to $\mathbf{550}_{M.N}$ (each row 1 to N in last column M). The rectifier in each shunt recovery circuit of the energy recovery circuits $\mathbf{514}_1$ to $\mathbf{514}_M$ is configured to rectify the extracted energy recovery signal into a rectified voltage signal that is used by the battery $\mathbf{546}_m$ and DC-DC converter $\mathbf{548}_m$ to supply the respective recovered voltage signal $\mathbf{536}_m$ to the drive circuit 110.

Figure 6:
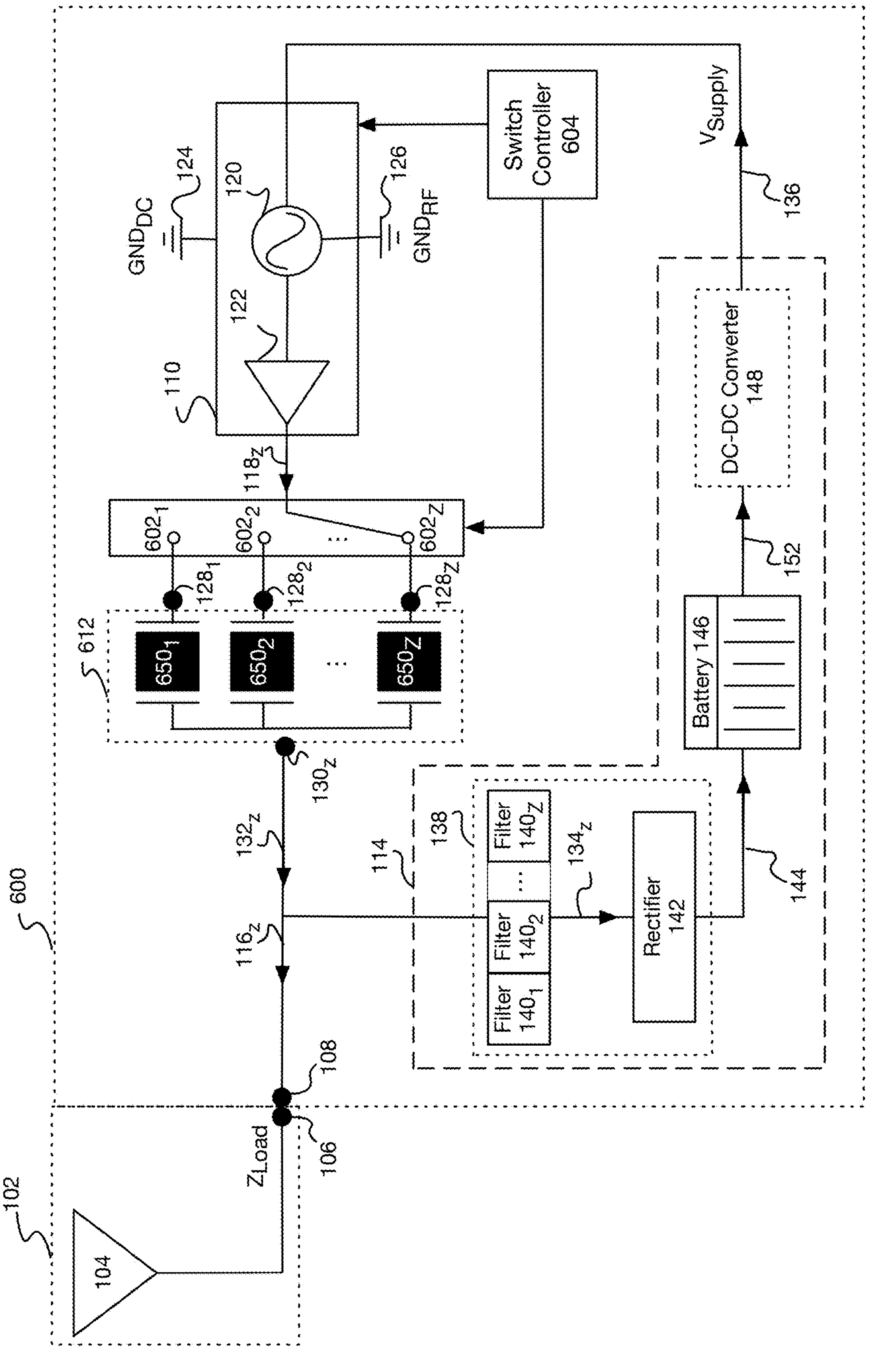
FIG. 6 is a diagram illustrating the transmitter circuit of FIG. 1 having an electromechanical matching network with a plurality of electromechanical resonators that are individually selected according to an embodiment.

FIG. 6 illustrates an embodiment of a transmitter circuit 600 that is similar to the transmitter circuit 100 of FIG. 1, except the electromechanical matching network 112 is illustrated as an electromechanical matching network 612 comprising a plurality of electromechanical resonators $\mathbf{650}_1$ to $\mathbf{650}_z$ that may be individually selected. The subscript Z is the number of center frequencies in a range of center frequencies from 1 to Z according to the embodiment illustrated in FIG. 6. The transmitter circuit 600 includes a plurality of switches 6021 to $\mathbf{602}_z$ and a switch controller 604 coupled to the drive circuit 110 and the plurality of switches 6021 to $\mathbf{602}_z$. The plurality of switches 6021 to $\mathbf{602}_z$ are coupled to input terminals 1281 to $\mathbf{128}_z$ of the electromechanical resonators $\mathbf{650}_1$ to $\mathbf{650}_z$. The switch controller 604 is configured to control the voltage-controlled oscillator 120 in the drive circuit 110 to select the center frequency in the range of center frequencies from 1 to Z for the drive signal $\mathbf{118}_z$. The switch controller 604 is also configured to control the plurality of switches 6021 to $\mathbf{602}_z$ to select one of the electromechanical resonators $\mathbf{650}_z$ in the electromechanical resonators $\mathbf{650}_1$ to $\mathbf{650}_z$ in response to the selected center frequency of the drive signal $\mathbf{118}_z$. The subscript z is the $z^{th}$ center frequency in the number of center frequencies 1 to Z. An example of a switch controller that controls a drive circuit to select a center frequency and controls a plurality of switches to select an electromechanical resonator from a plurality of electromechanical resonators in response to the selected center frequency is illustrated in commonly-owned U.S. Pending patent application Ser. No. 17/530,303 titled Antenna Dynamically Matched with Electromechanical Resonators, filed on Nov. 18, 2021, which is incorporated herein by reference in its entirety.

In the transmitter circuit 600, each electromechanical resonator $\mathbf{650}_z$ in the plurality of electromechanical resonators $\mathbf{650}_1$ to $\mathbf{650}_z$ is configured to provide a selected electromechanical matching signal $\mathbf{132}_z$ comprising the selected center frequency and a plurality of non-center frequencies in response to the drive signal $\mathbf{118}_z$. The energy recovery circuit 114 may include a plurality of filters $\mathbf{140}_1$ to $\mathbf{140}_z$ and the rectifier 142, according to an embodiment. Each electromechanical resonator $\mathbf{650}_z$ in the plurality of electromechanical resonators $\mathbf{650}_1$ to $\mathbf{650}_z$ may be uniquely associated with one of the filters $\mathbf{140}_z$ in the plurality of filters $\mathbf{140}_1$ to $\mathbf{140}_z$. Each filter $\mathbf{140}_z$ is uniquely configured to extract an energy recovery signal $\mathbf{134}_z$ from the selected electromechanical matching signal $\mathbf{132}_z$ at the output terminal $\mathbf{130}_z$. Each of the electromechanical resonators $\mathbf{650}_z$ may provide an electromechanical matching signal $\mathbf{132}_z$ having a bandwidth such that the uniquely associated filter $\mathbf{140}_z$ is tuned to isolate a non-center frequency that is distinct from non-center frequencies provided by other electromechanical resonators $\mathbf{650}_z$ in the plurality of electromechanical resonators $\mathbf{650}_1$ to $\mathbf{650}_z$, according to an embodiment. For example, the uniquely associated filter 1402 is tuned to isolate a non-center frequency that is distinct from non-center frequencies provided by neighboring or adjacent electromechanical resonator 650$_{z-1}$ and electromechanical resonator 650$_{z+1}$ according to an embodiment. The rectifier 142 may be configured to rectify the extracted energy recovery signal 134$_z$ into the rectified voltage signal 144 that is used for supplying the recovered voltage signal 136 to the drive circuit 110. Each of the filters 140$_z$ and the rectifier 142 may be configured according to the filter and rectifier circuit embodiments illustrated in the shunt recovery circuits of FIGS. 2-4. For example, similar to the filter 140 of FIG. 1, each filter 140$_z$ in the plurality of filters 140$_1$ to 140$_z$ is coupled in shunt between the transmitter terminal 108 and the output terminal 130$_z$ of the selected electromechanical resonator 650$_z$. The energy recovery signal 134$_z$ includes at least one non-center frequency from the plurality of non-center frequencies in the selected electromechanical matching signal 132$_z$. The transmitter terminal 108 provides the impedance matched signal 116$_z$ that represents the electromechanical matching signal 132$_z$ excluding the energy recovery signal 134$_z$. The impedance matched signal 116$_z$ includes the selected center frequency associated with selected electromechanical resonators 650$_z$ to resonate the load 102 at the resonant frequency.

According to another embodiment, the transmitter circuit 600 may include a plurality of energy recovery circuits, such as the energy recovery circuits illustrated in FIGS. 2-4, coupled to the plurality of electromechanical resonators 650$_1$ to 650$_z$. Each of the energy recovery circuits may be uniquely configured to extract an energy recovery signal from an electromechanical matching signal provided by one of the electromechanical resonators to supply a recovered voltage signal from the energy recovery signal to the drive circuit.

Figure 7:
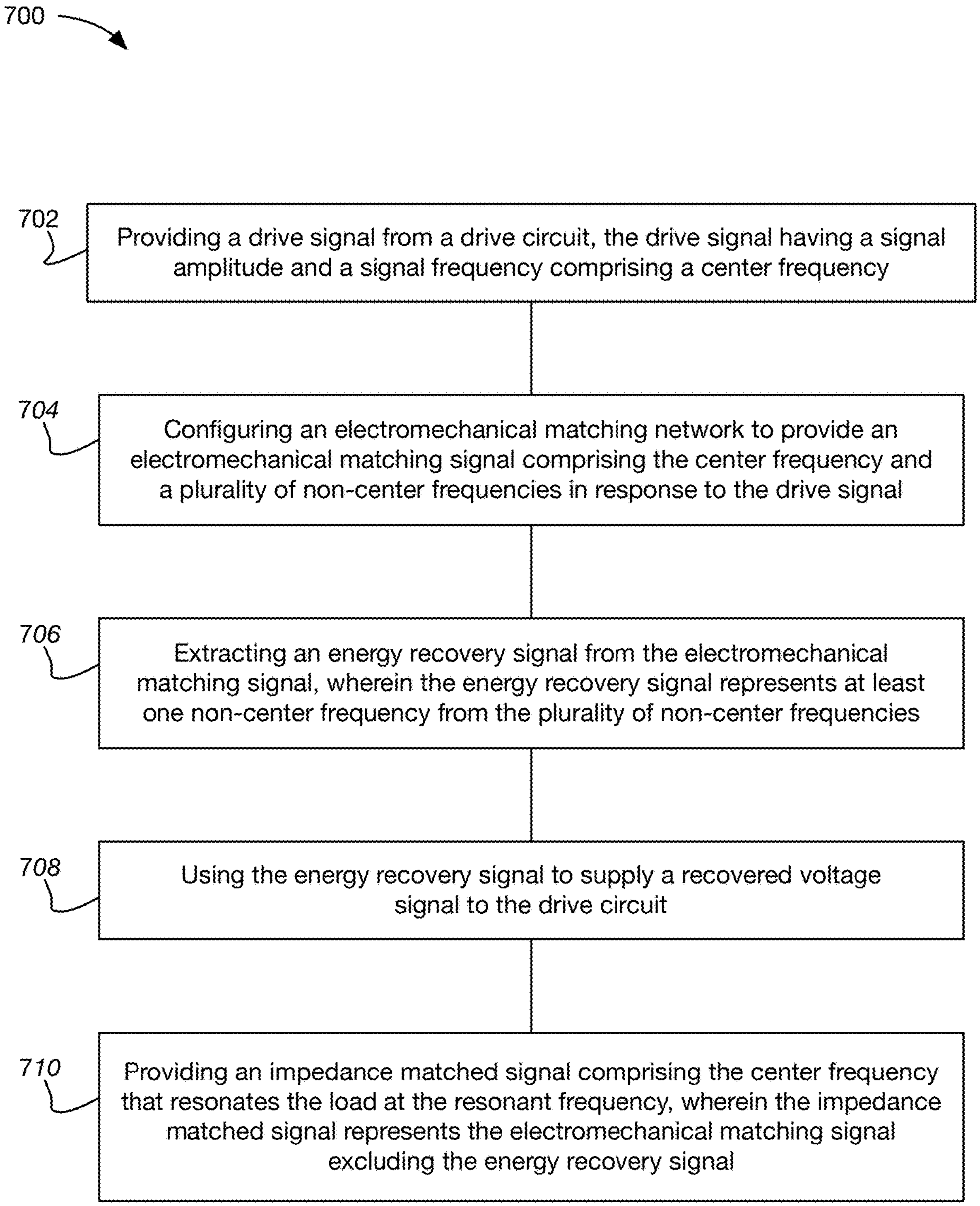
FIG. 7 is a flow chart illustrating a method of matching impedance to a load having a resonant frequency according to an embodiment.

FIG. 7 is a flow chart illustrating a method 700 of matching impedance to a load having a resonant frequency according to an embodiment. The method 700 includes providing a drive signal from a drive circuit at step 702. The drive signal has a signal amplitude and a signal frequency comprising a center frequency. At step 704, an electromechanical matching network is configured to provide an electromechanical matching signal comprising the center frequency and a plurality of non-center frequencies in response to the drive signal. At step 706, an energy recovery signal is extracted from the electromechanical matching signal. The energy recovery signal represents at least one non-center frequency from the plurality of non-center frequencies. The at least one non-center frequency may be a third harmonic frequency $3f_c$ from the electromechanical matching signal. In some embodiments, the at least one non-center frequency may include several harmonics such as the second harmonic frequency $2f_c$, the third harmonic frequency $3f_c$ and the fifth harmonic frequency $5f_c$.

At step 708, the energy recovery signal is used to supply a recovered voltage signal to the drive circuit. Step 710 includes providing an impedance matched signal comprising the center frequency that resonates the load at the resonant frequency. The impedance matched signal represents the electromechanical matching signal excluding the energy recovery signal. Method 700 may further include rectifying the extracted energy recovery signal into a rectified voltage signal that is used for supplying the recovered voltage signal to the drive circuit. Also, the method 700 may include storing voltage from the rectified voltage signal in a battery and converting the rectified voltage to supply the recovered voltage signal to the drive circuit.

Figure 8A:
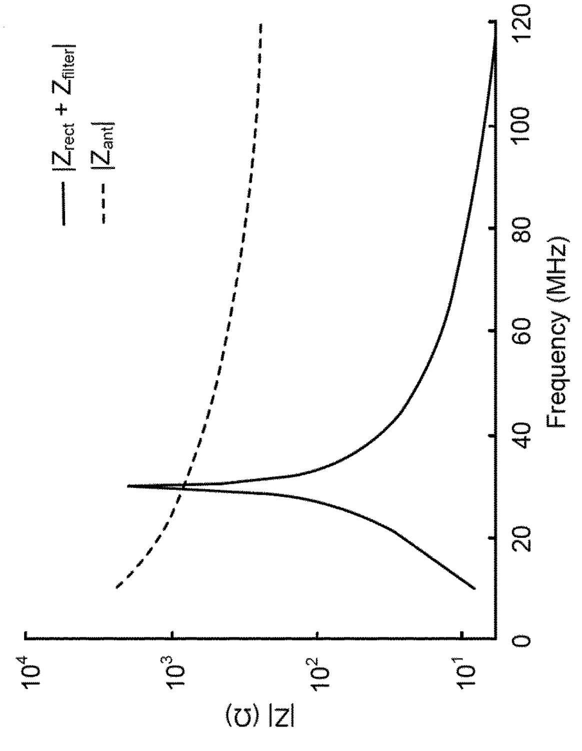
FIG. 8A is a plot of simulated impedance values as a function of frequency for an antenna and rectifier illustrated in the transmitter circuit of FIG. 2.
Figure 8B:
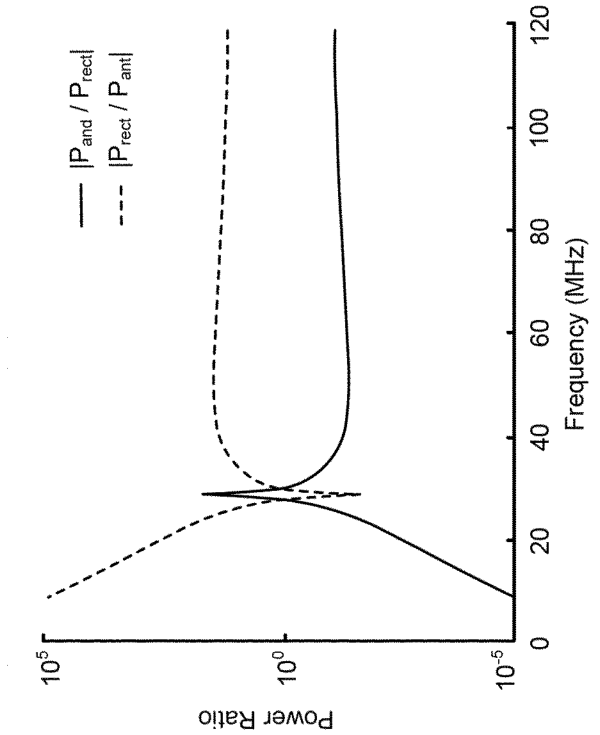
FIG. 8B is a plot of simulated ratio of power as a function of frequency delivered to the antenna and rectifier illustrated in the transmitter circuit of FIG. 2.

FIGS. 8A and 8B show simulated data to evaluate the circuit topology according to an embodiment of the transmitter circuit 200 FIG. 2. FIG. 8A is a plot of simulated impedance values as a function of frequency for an antenna such as antenna 104 and filter such as band reject filter 240, plus a rectifier circuit such as rectifier circuit 242. FIG. 8B is a plot of simulated ratio of power as a function of frequency delivered to the antenna and the rectifier.

The simulation data considers a 1 m 30 MHz monopole antenna in parallel with a band reject filter. The impedance of this antenna is given by the following equation:

$$Z_{ant}20(kl)^2 - j\frac{120}{kl}\left(\ln\frac{2l}{a} - 1\right),\ k = \frac{2\pi}{\lambda}$$

where l is the height of the monopole equal to 1 m, a is the antenna diameter set equal to 1 cm, and λ is the free space wavelength. The impedance of the band reject filter may be calculated by the following equation:

$$Z_{Filter} = \left(\frac{1}{R_L + j\omega L} + j\omega C\right)^{-1}$$

where ω is the frequency in radians, L is the inductance value of the inductor in the band reject filter set to 112.58 nH, $R_L$ is the series resistance associated with the inductor set equal to $\omega L/Q_L$ where $Q_L$ is the quality factor of the inductor set equal to 100, C is the capacitance associated with capacitor in the band reject filter set equal to 250 pF.

In this simulation, it is assumed that the series resistance of the capacitor is negligible and therefore not included in the analysis. The impedance of the rectifier circuit is assumed to be purely real and small in this case set to 1Ω.

As shown in FIG. 8A, the impedance of the filter and rectifier combination is much larger than the impedance of the antenna at the drive frequency of the system (i.e. 30 MHz), implying that at this frequency substantially more power is delivered to the antenna than the rectifier. Conversely at the second and third harmonics (i.e. 60 MHz and 90 MHz respectively), it can be seen that the opposite is true, implying that substantially more power at these frequencies is delivered to the rectifier than the antenna. To further illustrate the effect of the transmitter circuit 200, the simulation model evaluates the ratio of the power delivered to the antenna vs. the rectifier given by the following equation:

$$\frac{P_{ant}}{P_{rect}} = \frac{|I_{ant}|^2\mathrm{Re}\{Z_{ant}\}}{|I_{rect}|^2\mathrm{Re}\{Z_{rect}\}}$$

where $P_{ant}$ & $I_{ant}$ are the power radiated by the antenna and current delivered to the antenna respectively and $P_{rect}$ & $I_{rect}$ are the power and current delivered to the rectifier respectively. Because the rectifier and filter are in series, the current across both is the same and can be used interchangeably. Also, because the antenna and filter plus rectifier circuits are in parallel, both circuits will have the same voltage drop and therefore the following relationship for the ratio of their currents can be derived:

$$I_{ant}Z_{ant} = I_{rect}(Z_{rect} + Z_{filter}) \rightarrow \frac{|I_{ant}|^2}{|I_{rect}|^2} = \frac{|Z_{rect} + Z_{filter}|^2}{|Z_{ant}|^2}$$

Substituting this equation into the above equation, the following relationship between the power delivered to the antenna and rectifier can be derived:

$$\frac{P_{ant}}{P_{rect}} = \frac{|Z_{rect} + Z_{filter}|^2 \mathrm{Re}\{Z_{ant}\}}{|Z_{ant}|^2 \mathrm{Re}\{Z_{rect}\}}$$

FIG. 8B shows results of the above equation. From this analysis, substantially most power is delivered to the antenna at the drive frequency of the system (~98%), while at the harmonics most power is delivered to the rectifier (~96% and ~94% at the second and third harmonics respectively).

Figure 9B:
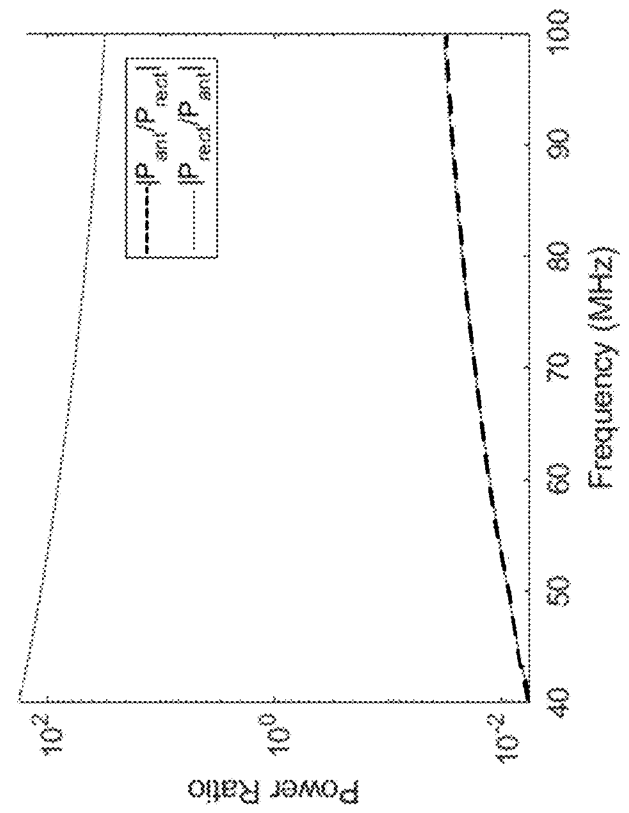
FIG. 9B is a plot of simulated ratio of power as a function of frequency delivered to the antenna and rectifier illustrated in the transmitter circuit of FIG. 4, where the simulation shows that the second and third harmonic provide the majority of incident power delivered to the rectifier.
Figure 9A:
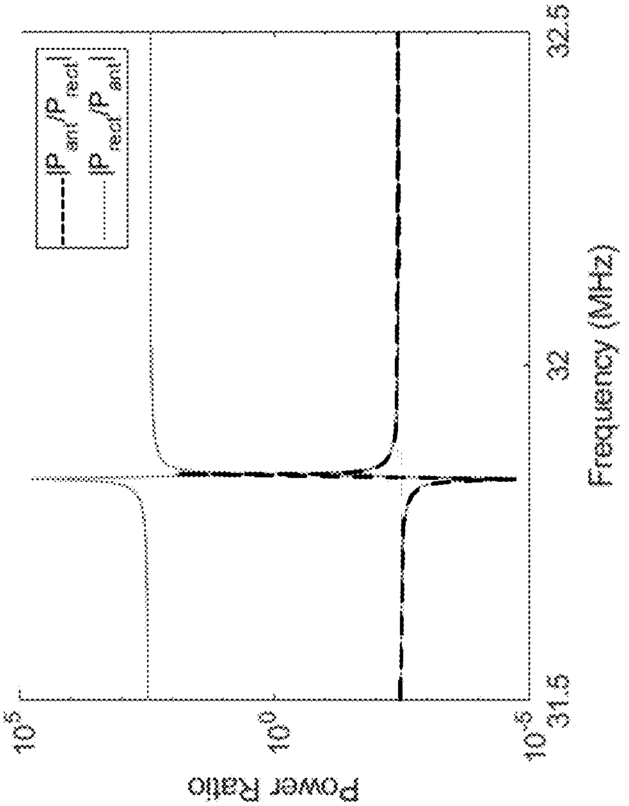
FIG. 9A is a plot of simulated ratio of power as a function of frequency delivered to the antenna and rectifier illustrated in the transmitter circuit of FIG. 4, where the simulation shows that a drive frequency of the majority of incident power is delivered to the antenna.

FIGS. 9A and 9B show simulated data to evaluate the circuit topology according to an embodiment of the transmitter circuit 400 in FIG. 4. The simulated data shows the power ratio for an embodiment in which the band reject filter is replaced with an array of identical parallel electromechanical resonators designed to have their parallel resonances at the drive frequency of the system. Resonators 4201 to 420F may be modeled by a Butterworth-Van Dyke circuit model which includes a series RLC resonator in parallel with a capacitor. The modeling of the resonators 4201 to 420F is illustrated in commonly-owned U.S. Pending patent application Ser. No. 17/530,303 titled Antenna Dynamically Matched with Electromechanical Resonators, filed on Nov. 18, 2021, which is incorporated herein by reference in its entirety.

The nominal parameter values for a 32 MHz quartz shear mode resonator are given in the Table 1 below:

TABLE 1

| Parameter | Value |
|---|---|
| $C_0$ | 0.8 pF |
| $C_m$ | 5 fF |
| $L_m$ | 5 mH |
| $R_m$ | 3 Ω |

To observe the effect of the embodiment illustrated in FIG. 4, the impedance of a parallel array of 30 of the 32 MHz quartz shear mode resonators may be computed using the equation below and used to determine the power ratio as a function of frequency using the above equations:

$$Z_{Filter} = \left(\left(\frac{1}{R_m + j\omega L_m} + j\omega C_m\right)^{-1} + j\omega C_0\right)^{-1}$$

where N is the number of parallel resonators in this case set to equal 30. As shown in FIG. 9A, for a drive frequency of 31.8384 MHz the majority of incident power is delivered to the antenna 104 (~98.8%). Similarly as seen in FIG. 9B, at the second and third harmonic the majority of incident power is delivered to the rectifier (~98.57% and ~97%).

A number of example embodiments have been described. Nevertheless, it will be understood that various modifications may be made without departing from the spirit and scope of the devices and methods described herein.

What is claimed is:

1. A transmitter circuit for impedance matching to a load having a resonant frequency, the transmitter circuit comprising:

a transmitter terminal that provides an impedance matched signal comprising a center frequency that resonates the load at the resonant frequency;

a drive circuit configured to provide a drive signal having a signal amplitude and a signal frequency comprising the center frequency;

an electromechanical matching network configured to provide an electromechanical matching signal comprising the center frequency and a plurality of non-center frequencies in response to the drive signal; and an energy recovery circuit configured to extract an energy recovery signal from the electromechanical matching signal and to supply a recovered voltage signal from the energy recovery signal to the drive circuit;

wherein:

the energy recovery signal represents at least one non-center frequency from the plurality of non-center frequencies; and the impedance matched signal represents the electromechanical matching signal excluding the energy recovery signal.

2. The transmitter circuit of claim 1, wherein the energy recovery circuit is coupled in shunt between the transmitter terminal and an output of the electromechanical matching network.

3. The transmitter circuit of claim 1, wherein the energy recovery circuit comprises a shunt recovery circuit coupled in shunt between the transmitter terminal and an output of the electromechanical matching network, the shunt recovery circuit comprising:

a filter configured to extract the energy recovery signal from the electromechanical matching signal; and a rectifier coupled in series with the filter, wherein the rectifier is configured to rectify the extracted energy recovery signal into a rectified voltage signal that is used for supplying the recovered voltage signal to the drive circuit.

4. The transmitter circuit of claim 3, wherein the energy recovery circuit comprises a battery coupled to the shunt recovery circuit, wherein the battery is configured to store voltage from the rectified voltage signal.

5. The transmitter circuit of claim 3, wherein the energy recovery circuit comprises a DC-DC converter configured to supply the recovered voltage signal to the drive circuit.

6. The transmitter circuit of claim 3 wherein the filter is selected from the group consisting of a band reject filter and a bandpass filter.

7. The transmitter circuit of claim 3, wherein:

the filter comprises at least one electromechanical resonator configured to extract the at least one non-center frequency from the plurality of non-center frequencies in the electromechanical matching signal; and the rectifier is configured to rectify the extracted at least one non-center frequency into a recovered voltage that is supplied back to the drive circuit.

8. The transmitter circuit of claim 1, wherein the electromechanical matching network comprises at least one electromechanical resonator having a nonlinear response to the signal amplitude.

9. The transmitter circuit of claim 1, further comprising a group of energy recovery circuits, wherein:

the electromechanical matching network comprises an array of electromechanical resonators; and the group of energy recovery circuits are coupled to the array of electromechanical resonators.

10. The transmitter circuit of claim 9, wherein:

the array of electromechanical resonators are configured in M columns by N rows of electromechanical resonators, where the index N represents a number of rows 1 to N, the index n represents an $n^{th}$ row in the rows 1 to N, the index M represents a number of columns 1 to M, and the index m represents an $m^{th}$ column in the columns 1 to M;

each energy recovery circuit in a group of M−1 energy recovery circuits comprises a group of N shunt recovery circuits;

the $m^{th}$ energy recovery circuit is uniquely coupled to the $m^{th}$ column of electromechanical resonators; and the $n^{th}$ shunt recovery circuit in each of the group of M−1 energy recovery circuits is uniquely coupled in shunt to an output terminal of an electromechanical resonator in the $n^{th}$ row of electromechanical resonators.

11. The transmitter circuit of claim 1, further comprising a plurality of switches and a switch controller coupled to the drive circuit and the plurality of switches, wherein:

the electromechanical matching network comprises a plurality of electromechanical resonators coupled to the plurality of switches; and the switch controller is configured to control the drive circuit to select the center frequency from a range of center frequencies for the drive signal and control the plurality of switches to select one of the electromechanical resonators from the plurality of electromechanical resonators in response to the selected center frequency of the drive signal.

12. A transmitter system comprising:

a load having a resonant frequency;

a transmitter terminal that provides an impedance matched signal comprising a center frequency that resonates the load at the resonant frequency;

a drive circuit configured to provide a drive signal having a signal amplitude and a signal frequency comprising the center frequency;

an electromechanical matching network configured to provide an electromechanical matching signal comprising the center frequency and a plurality of non-center frequencies in response to the drive signal; and an energy recovery circuit configured to extract an energy recovery signal from the electromechanical matching signal and to supply a recovered voltage signal from the energy recovery signal to the drive circuit;

wherein:

the energy recovery signal represents at least one non-center frequency from the plurality of non-center frequencies; and the impedance matched signal represents the electromechanical matching signal excluding the energy recovery signal.

13. The transmitter system of claim 12, wherein the energy recovery circuit is coupled in shunt between the transmitter terminal and an output of the electromechanical matching network.

14. The transmitter system of claim 12, wherein the energy recovery circuit comprises a shunt recovery circuit coupled in shunt between the transmitter terminal and an output of the electromechanical matching network, the shunt recovery circuit comprises:

a filter configured to extract the energy recovery signal from the electromechanical matching signal; and a rectifier coupled in series with the filter, wherein the rectifier is configured to rectify the extracted energy recovery signal into a rectified voltage signal that is used for supplying the recovered voltage signal to the drive circuit.

15. The transmitter system of claim 12, wherein the electromechanical matching network comprises at least one electromechanical resonator having a nonlinear response to the signal amplitude.

16. The transmitter system of claim 14, wherein the filter is selected from the group consisting of a band reject filter and a bandpass filter.

17. The transmitter system of claim 14, wherein:

the filter comprises at least one electromechanical resonator configured to extract the at least one non-center frequency from the plurality of non-center frequencies in the electromechanical matching signal; and the rectifier is configured to rectify the extracted at least one non-center frequency into a recovered voltage that is supplied back to the drive circuit.

18. A method of matching impedance to a load having a resonant frequency, the method comprising the steps of:

providing a drive signal from a drive circuit, the drive signal having a signal amplitude and a signal frequency comprising a center frequency;

configuring an electromechanical matching network to provide an electromechanical matching signal comprising the center frequency and a plurality of non-center frequencies in response to the drive signal;

extracting an energy recovery signal from the electromechanical matching signal, wherein the energy recovery signal represents at least one non-center frequency from the plurality of non-center frequencies;

using the energy recovery signal to supply a recovered voltage signal to the drive circuit; and providing an impedance matched signal comprising the center frequency that resonates the load at the resonant frequency, wherein the impedance matched signal represents the electromechanical matching signal excluding the energy recovery signal.

19. The method of claim 18, further comprising rectifying the extracted energy recovery signal into a rectified voltage signal that is used for supplying the recovered voltage signal to the drive circuit.

20. The method of claim 19, further comprising storing voltage from the rectified voltage signal in a battery.

21. The method of claim 19 further comprising converting voltage from the rectified voltage signal into the recovered voltage signal that is supplied to the drive circuit.

22. The method of claim 18, further comprising providing at least one electromechanical resonator in the electromechanical matching network, wherein the at least one electromechanical resonator has a nonlinear response to the signal amplitude.

* * * * *